United States Patent [19]

Jeong

[11] Patent Number: 5,113,484
[45] Date of Patent: May 12, 1992

[54] RANK FILTER USING NEURAL NEWWORK

[75] Inventor: Ho-sun Jeong, Taegu, Rep. of Korea

[73] Assignee: Samsung Electronics Co., Ltd., Kyunggi, Rep. of Korea

[21] Appl. No.: 549,306

[22] Filed: Jul. 9, 1990

[30] Foreign Application Priority Data

Apr. 3, 1990 [KR] Rep. of Korea .................. 90-4510

[51] Int. Cl.⁵ .............................................. G06F 15/31
[52] U.S. Cl. .................................... 395/24; 364/724.01
[58] Field of Search ............... 364/513, 900, 715.06, 364/724.01; 365/189.07; 340/146.2

[56] References Cited

U.S. PATENT DOCUMENTS

4,493,093 1/1985 Veillard ..................... 340/146.2
4,866,645 9/1989 Lish ........................... 364/602
4,868,773 9/1989 Coyle et al. ............... 364/724.01
4,972,363 11/1990 Nguyen et al. ............. 364/148

Primary Examiner—Michael R. Fleming
Assistant Examiner—George Davis
Attorney, Agent, or Firm—Cushman, Darby & Cushman

[57] ABSTRACT

A rank filter is provided which can be used for improving an image signal degraded by noise, while at the same time maintaining edge information. The rank filter is implemented by using a neural network and obtains a high processing speed with a simple circuit arrangement, as compared to conventional rank filters, HPFs, LPFs and average filters. The rank filter using the concept of a neural network includes decoder devices, a comparison device and a counter.

8 Claims, 6 Drawing Sheets

RANK FILTER USING NEURAL NEWWORK

FIELD OF THE INVENTION

The present invention relates to a rank filter, and more particularly to a rank filter using the concept of neural network for processing and improving an image at high speed, which has been degraded by noise.

BACKGROUND OF THE INVENTION

Generally, in an image or a letter recognition system, analysis of image information is performed by classification or discrimination of an image signal inputted from an image input system, such as a camera or an image scanner. However, the image signal inputted from the image input system is frequently accompanied by distortion or noise.

It is difficult to classify or discern an image which has been degraded by distortion or noise. Thus, it is much more effective if analysis of the image information is performed after improving the degraded image.

A LPF, an HPF, an average filter, etc., can be used to improve the degraded image, but all of these filters have a disadvantage in that an edge of the image information can be easily distorted or lost. Therefore, rank filters are widely used as a means for improving image information while at the same time maintaining the edge information.

Such rank filters have been described in the following papers: [I] R. M. Hodgson, D. G. Bailey, M. J. Naylor, A. L. M. Ng and S. J. Mcneill, Properties, implementations and applications of rank filters, image and vision computing, Vol. 3, No. 1, Feb. 1985., [II] Ho-Ming Lin, Alan N. Willson, Median Filtering with Adaptive Length, IEEE Transactions on circuits and systems, Vol. 35, No. 6, June 1988., [III] J. Patrick Fitch, Edward J. Coyle, and C. Gallagher, JR, Median Filtering By Threshold Decomposition, IEEE ASSP, Vol. ASSP-32, No. 6, 1984., [IV] Kemal Oflazer, Design and Implementation of Single chip 1-D Median Filter, IEEE ASSP, Vol. ASSP-31, No. 5, 1983.

However, conventional rank filters implemented by using general logic circuits have low processing speed, a large volume and a complex circuit arrangement.

SUMMARY OF THE INVENTION

It is an object of the present invention to provide a rank filter using the concept of a neural network which can improve degraded image information at high speed, by a parallel dispersion processing method.

To accomplish the objective, a rank filter is provided for extracting a data value corresponding to a predetermined rank among M kinds of N-bit data in accordance with the magnitude order of the data values. The rank filter, according to the present invention, includes M units of decoder devices having $2^N-1$ levels, which are provided for converting each N-bit input data value into an excited state for all levels equal to and less than the corresponding magnitude and a ground state for the other levels, i.e., levels above the corresponding magnitude. The rank filter also includes a comparison device having $2^N-1$ levels, which is provided for outputting the data value corresponding to the predetermined rank which is converted into an excited state for the level at which the number of ground states is greater than or equal to the value of the predetermined rank, and is converted into a ground state for the other levels of the respective level outputs of M units of the decoder devices.

Also provided in the rank filter is a counter for outputting the data value corresponding to a predetermined rank by counting the number of ground states among the outputs of the comparison device. The decoder devices, the comparison device and the counter are implemented by PMOS and NMOS transistors using the concept of a neural network.

These objects and features of the present invention will become more readily apparent from the detailed description, which follows, and the appended drawings.

DESCRIPTION OF THE PREFERRED EMBODIMENT OF THE INVENTION

To begin with, the concept of a rank filter or a median filter is briefly explained in order to help in understanding a rank filter.

A rank filter replaces a value, corresponding to a predetermined rank, among multiple values of, for example, the lightness and darkness degree of image elements, within a mask. That is, replacement of the value at the center position of a planerized region of an image element.

Figure 1:
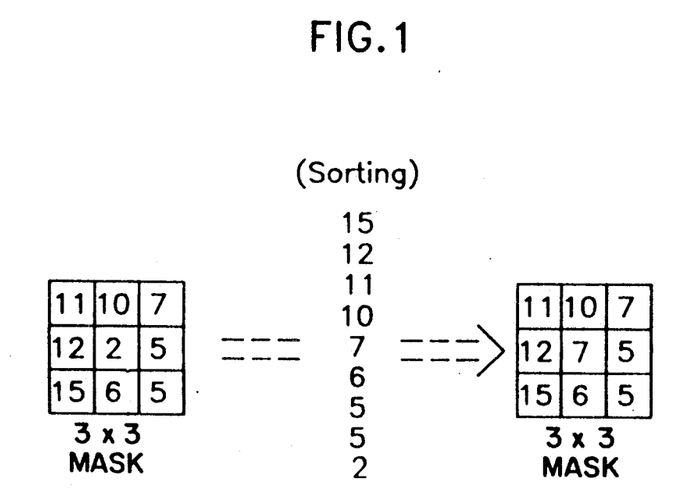
FIG. 1 is a concept diagram for explaining the concept of a rank filter.

FIG. 1 shows an example of performing a rank filtering in the case of data values having lightness and darkness degrees given by 4-bit data words. If the values of the lightness and darkness degree of the image elements within a 3×3 mask are arranged starting with the largest number and ending with the smallest number they become 15, 12, 11, 10, 7, 6, 5, 5, 2.

In the case of a predetermined rank of 5, the image element at the center position, which has a value of 2, is replaced by the value of 7 whose magnitude corresponds to the fifth value among 9 input values. More particularly, since the value of 7 is a median value among nine input values, the filter is referred to as a median filter.

Figure 2A:
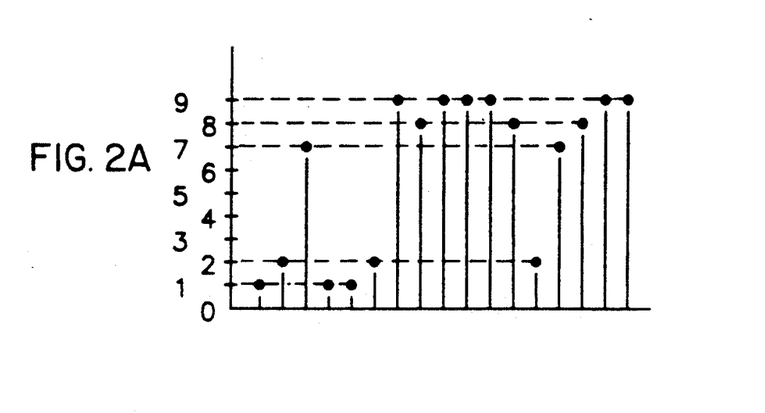
FIG. 2A is a waveform diagram showing an input degraded by noise.
Figure 2B:
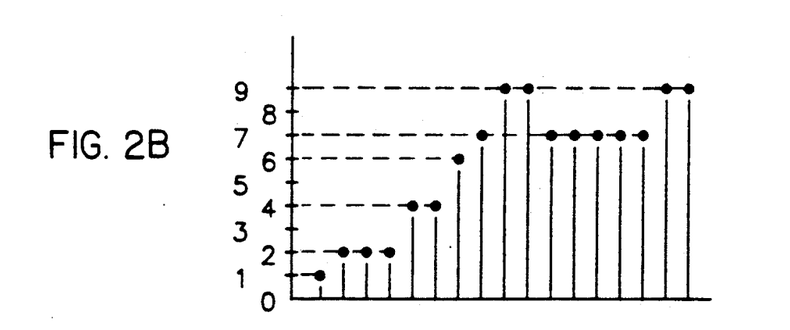
FIG. 2B is a waveform resulting from five point average value filtering.
Figure 2C:
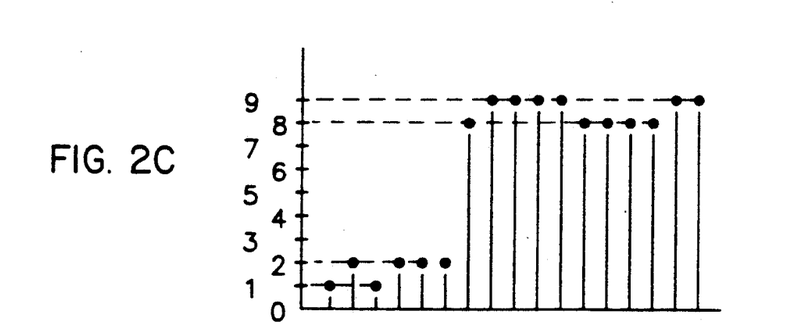
FIG. 2C is a waveform resulting from median filtering.

FIGS. 2A, 2B and 2C illustrates that the median filter is an excellent filter, with respect to removing noise as well as maintaining a discontinuous edge region which is shown in the step function, as compared to an average filter. The waveform diagram of FIG. 2A depicts an input degraded by noises which are mixed at the third and the thirteenth input signal of the waveform diagram A. The waveform diagram of FIG. 2B shows the result of 5 point average value filtering, in which the magnitude of the third input is determined as the average value of 2 after adding the magnitudes of the first input value through to the fifth input value, as given in the waveform of FIG. 2A, and averaging. The magnitudes of the other inputs are replaced by the same method.

Thus, as can be seen from comparing the average filtered the waveform of FIG. 2B to the median filter, using a predetermined rank of 3, as in FIG. 2C, the median filter better maintains edge information and removes noise, as compared with the average filter.

Besides the function of removing noise, a median filter can have application for several other functions. First an edge of the image can be changed, that is, the edge can be shrunk or expanded by using a median filter of rank 1 or 9. Also, applications such as edge detection or LPF, etc., are possible by combining some outputs of the rank filter. For example, edge detection can be performed by combining the outputs of rank filters having predetermined rank values of 1 and 9, respectively. In this way an edge is detected when the combination output is between 1 and 9, and background or image information is detected when the combination output is 1 or less or 9 or more, respectively. Furthermore, low pass filtering can be performed when a rank filter having a predetermined value is used to cut off an input which has a value above the predetermined value.

Figure 3:
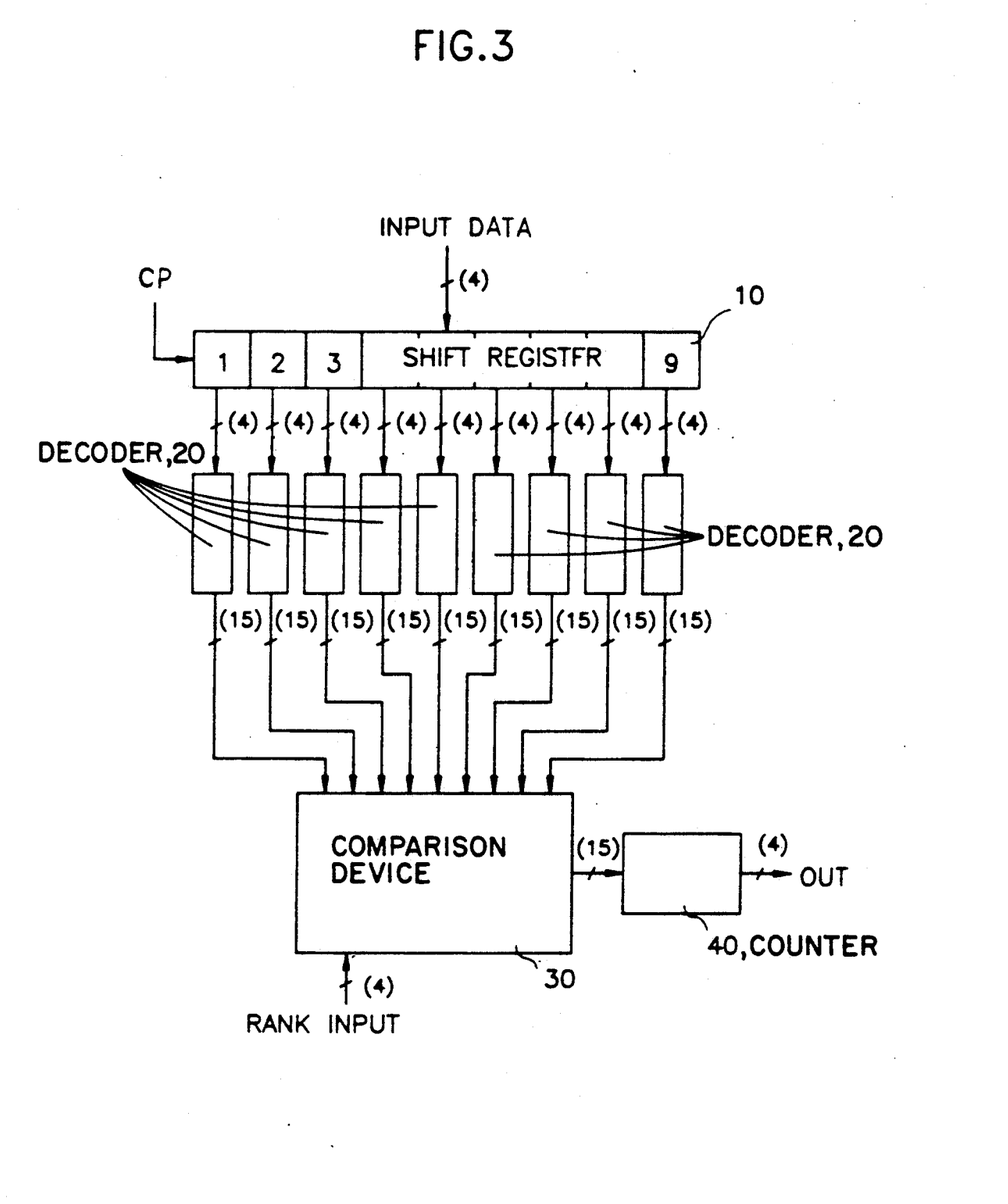
FIG. 3 is a block diagram showing a preferred embodiment of a rank filter implemented by the present invention.

A median filter showing one embodiment of the present invention will now be explained. FIG. 3 illustrates a block diagram of a rank filter for replacing the value of the center position with the median value, according to the magnitude order of the nine inputs of a 3×3 mask.

The rank filter of FIG. 3 comprises nine shift registers 10 for receiving the nine 4-bit inputs sequentially; nine decoder devices 20 for respectively receiving the 4-bit input data through the shift registers 10; a comparison device 30 for comparing the respective fifteen level outputs of the nine decoder devices 20, with a rank input; and an 0's counter 40 for counting the number of "0s" among the fifteen level outputs of the comparison device 30.

The shift register 10, comprising a conventional logic circuit, shifts the 4-bit input data which are inputted serially in accordance with the clock pulse CP. Thus, shift register 10 serially receives the nine 4-bit inputs, and outputs parallely the nine 4-bit inputs to the nine decoder devices 20 after the inputting of the data is completed.

Figures 4A, 4B:
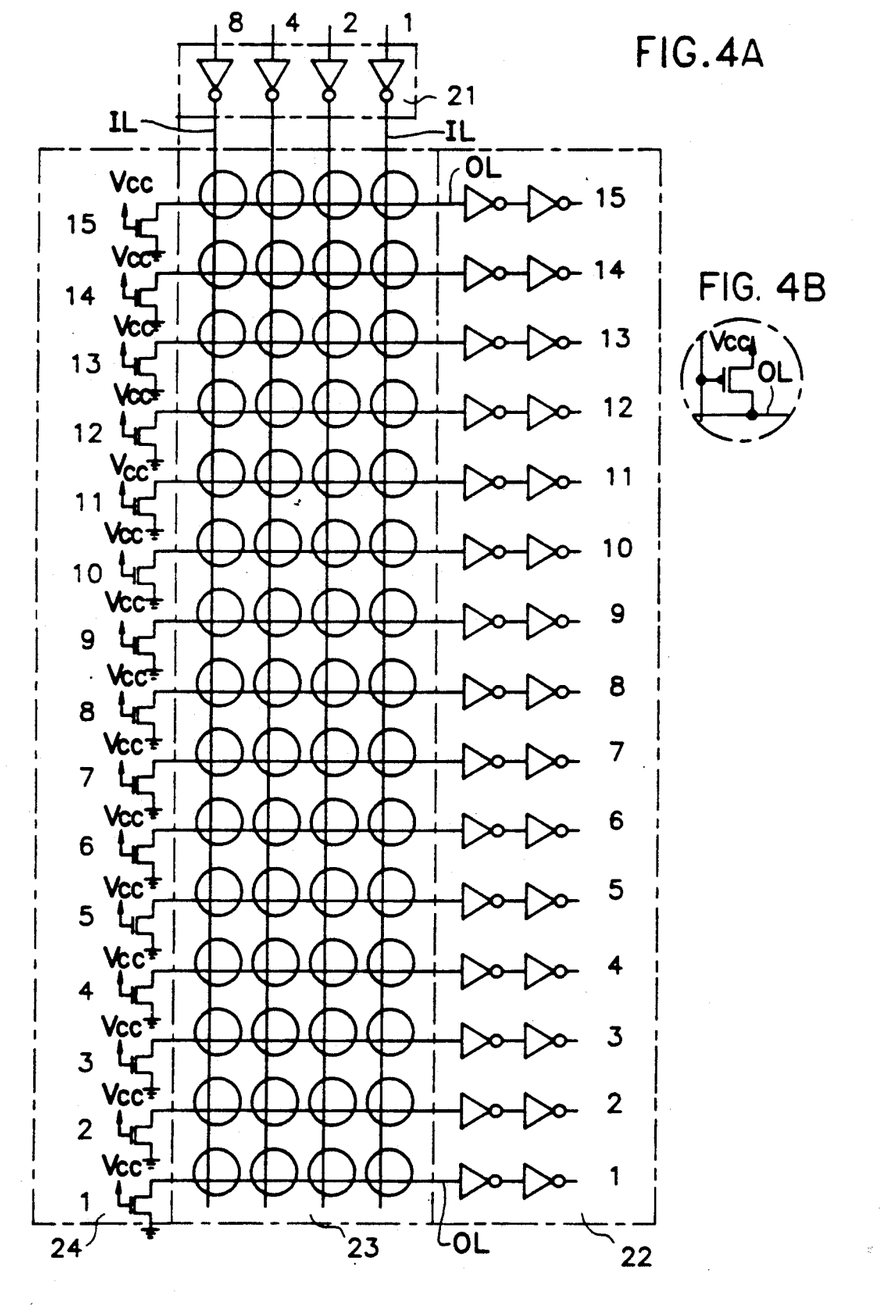
FIG. 4A is a circuit diagram showing one embodiment of the decoder device shown in FIG. 3.
FIG. 4B is a circuit diagram detail showing the construction of an individual input neuron synapse of the embodiment of FIG. 3.

As shown in FIG. 4A, each decoder device 20 having the fifteen ($2^4-1$) levels, generates fifteen outputs by decoding 4-bit input data into the "1" state for the level of the corresponding magnitude, and into the "0" state for the other levels.

Each decoder device 20 includes: four inverters 21 for inverting the 4-bit input data; fifteen neurons comprising CMOS buffers 22 for outputting the fifteen levels; input synapses (shown in detail in FIG. 4B) comprising PMOS transistors 23 for connecting a first power source voltage Vcc to the output line OL with the connecting strength being weighted in accordance with the weight of the 8,4,2,1 bit signals, respectively, applied to each input line IL; and bias synapses comprising NMOS transistors 24 for connecting a second power source voltage (ground potential) to the output lines OL with a weighted connecting strength of 1 to 15 according to each level.

Therefore, each neuron (that is, each CMOS buffer) outputs "1" if the summation of the connecting strength of the PMOS transistors, i.e., the input synapses connected to the corresponding output line OL, is greater than the connecting strength of the NMOS transistors. Furthermore, the bias synapses and each CMOS buffer outputs "0" if the summation of the connecting strength of the PMOS transistors is less than that of the NMOS transistors.

The connecting strength of the PMOS transistors is defined as the conductance value of the PMOS transistors. A reference conductance value, which corresponds to a unit connecting strength of 1, means that the geometrical aspect ratio of the PMOS transistor, defined as the width of the channel W divided by length of the channel L, is 6 $\mu m/2$ $\mu m$.

Further, the connecting strength of the NMOS transistors is defined as the conductance value of the NMOS transistors. A reference conductance value, which corresponds to a unit connecting strength of 1, means that the W/L value is 2 $\mu m/2$ $\mu m$. Therefore, in the case of the PMOS and NMOS transistors both being turned on, the PMOS transistors are stronger (have greater connecting strength) than the NMOS transistors.

More particularly, when the input is the 4 bit digital signal 1111, the value of the digit signal equals 15 ($1\times2^3+1\times2^2+1\times2^1+1\times2^0=15$). Therefore, the digits from the least significant digit to the most significant digit have respective weight values of $2^0, 2^1, 2^2$, and $2^3$, i.e., 1,2,4 and 8.

Accordingly, in order to set 4 input lines (IL) with respective weight values, the geometric aspect ratios (the channel width/the channel length) of the PMOS transistors constituting input synapses become 8×(6/2), 4×(6/2), 2×(6/2) and 1×(6/2) [$\mu m/\mu m$] from left to right. As a result, the PMOS transistor turns on when the value of the input line connected to the gate of the PMOS transistor is "0" so that the transistor supplies the first power source voltage (Vcc) to the output line connected to the drain thereof, with the current driving capacity according to the geometric aspect ratio. That is, the connect strengths of the respective input synapses have the weight values given to the input lines.

While, the bias synapses, i.e., NMOS transistors are made such that they have the respective geometric aspect ratios of 15(2/2), 14(2/2)...2(2/2) and 1(2/2) [$\mu m/\mu m$] from top to bottom to decide the ranking of the output lines. Therefore, the NMOS transistors turn on when the gates of the NMOS transistors are supplied with the first power source voltage (Vcc) so that the NMOS transistors supply the second power source voltage (ground voltage) to the output line with connection strength, i.e., current driving capacity of 15, 14...,2, and 1 according to the geometric aspect ratio.

The relationship between the input and the output of the decoder device 20 is given in Table. 1.

TABLE 1

| IN | | | | IN̄ | | | | Summation of the connecting strength of input synapse | OUTPUT | | | | | | | | | | | | | | |
|---|---|---|---|---|---|---|---|---|---|---|---|---|---|---|---|---|---|---|---|---|---|---|---|---|
| 8 | 4 | 2 | 1 | | | | | | 15 | 14 | 13 | 12 | 11 | 10 | 9 | 8 | 7 | 6 | 5 | 4 | 3 | 2 | 1 |
| 0 | 0 | 0 | 0 | 1 | 1 | 1 | 1 | 0 | 0 | 0 | 0 | 0 | 0 | 0 | 0 | 0 | 0 | 0 | 0 | 0 | 0 | 0 | 0 |
| 0 | 0 | 0 | 1 | 1 | 1 | 1 | 0 | 1 | 0 | 0 | 0 | 0 | 0 | 0 | 0 | 0 | 0 | 0 | 0 | 0 | 0 | 0 | 1 |
| 0 | 0 | 1 | 0 | 1 | 1 | 0 | 1 | 2 | 0 | 0 | 0 | 0 | 0 | 0 | 0 | 0 | 0 | 0 | 0 | 0 | 0 | 1 | 1 |
| 0 | 0 | 1 | 1 | 1 | 1 | 0 | 0 | 3 | 0 | 0 | 0 | 0 | 0 | 0 | 0 | 0 | 0 | 0 | 0 | 0 | 1 | 1 | 1 |
| 0 | 1 | 0 | 0 | 1 | 0 | 1 | 1 | 4 | 0 | 0 | 0 | 0 | 0 | 0 | 0 | 0 | 0 | 0 | 0 | 1 | 1 | 1 | 1 |
| 0 | 1 | 0 | 1 | 1 | 0 | 1 | 0 | 5 | 0 | 0 | 0 | 0 | 0 | 0 | 0 | 0 | 0 | 0 | 1 | 1 | 1 | 1 | 1 |
| 0 | 1 | 1 | 0 | 1 | 0 | 0 | 1 | 6 | 0 | 0 | 0 | 0 | 0 | 0 | 0 | 0 | 0 | 1 | 1 | 1 | 1 | 1 | 1 |
| 0 | 1 | 1 | 1 | 1 | 0 | 0 | 0 | 7 | 0 | 0 | 0 | 0 | 0 | 0 | 0 | 0 | 1 | 1 | 1 | 1 | 1 | 1 | 1 |
| 1 | 0 | 0 | 0 | 0 | 1 | 1 | 1 | 8 | 0 | 0 | 0 | 0 | 0 | 0 | 0 | 1 | 1 | 1 | 1 | 1 | 1 | 1 | 1 |
| 1 | 0 | 0 | 1 | 0 | 1 | 1 | 0 | 9 | 0 | 0 | 0 | 0 | 0 | 0 | 1 | 1 | 1 | 1 | 1 | 1 | 1 | 1 | 1 |
| 1 | 0 | 1 | 0 | 0 | 1 | 0 | 1 | 10 | 0 | 0 | 0 | 0 | 0 | 1 | 1 | 1 | 1 | 1 | 1 | 1 | 1 | 1 | 1 |
| 1 | 0 | 1 | 1 | 0 | 1 | 0 | 0 | 11 | 0 | 0 | 0 | 0 | 1 | 1 | 1 | 1 | 1 | 1 | 1 | 1 | 1 | 1 | 1 |
| 1 | 1 | 0 | 0 | 0 | 0 | 1 | 1 | 12 | 0 | 0 | 0 | 1 | 1 | 1 | 1 | 1 | 1 | 1 | 1 | 1 | 1 | 1 | 1 |
| 1 | 1 | 0 | 1 | 0 | 0 | 1 | 0 | 13 | 0 | 0 | 1 | 1 | 1 | 1 | 1 | 1 | 1 | 1 | 1 | 1 | 1 | 1 | 1 |
| 1 | 1 | 1 | 0 | 0 | 0 | 0 | 1 | 14 | 0 | 1 | 1 | 1 | 1 | 1 | 1 | 1 | 1 | 1 | 1 | 1 | 1 | 1 | 1 |
| 1 | 1 | 1 | 1 | 0 | 0 | 0 | 0 | 15 | 1 | 1 | 1 | 1 | 1 | 1 | 1 | 1 | 1 | 1 | 1 | 1 | 1 | 1 | 1 |

Figures 5A, 5B, 5C:
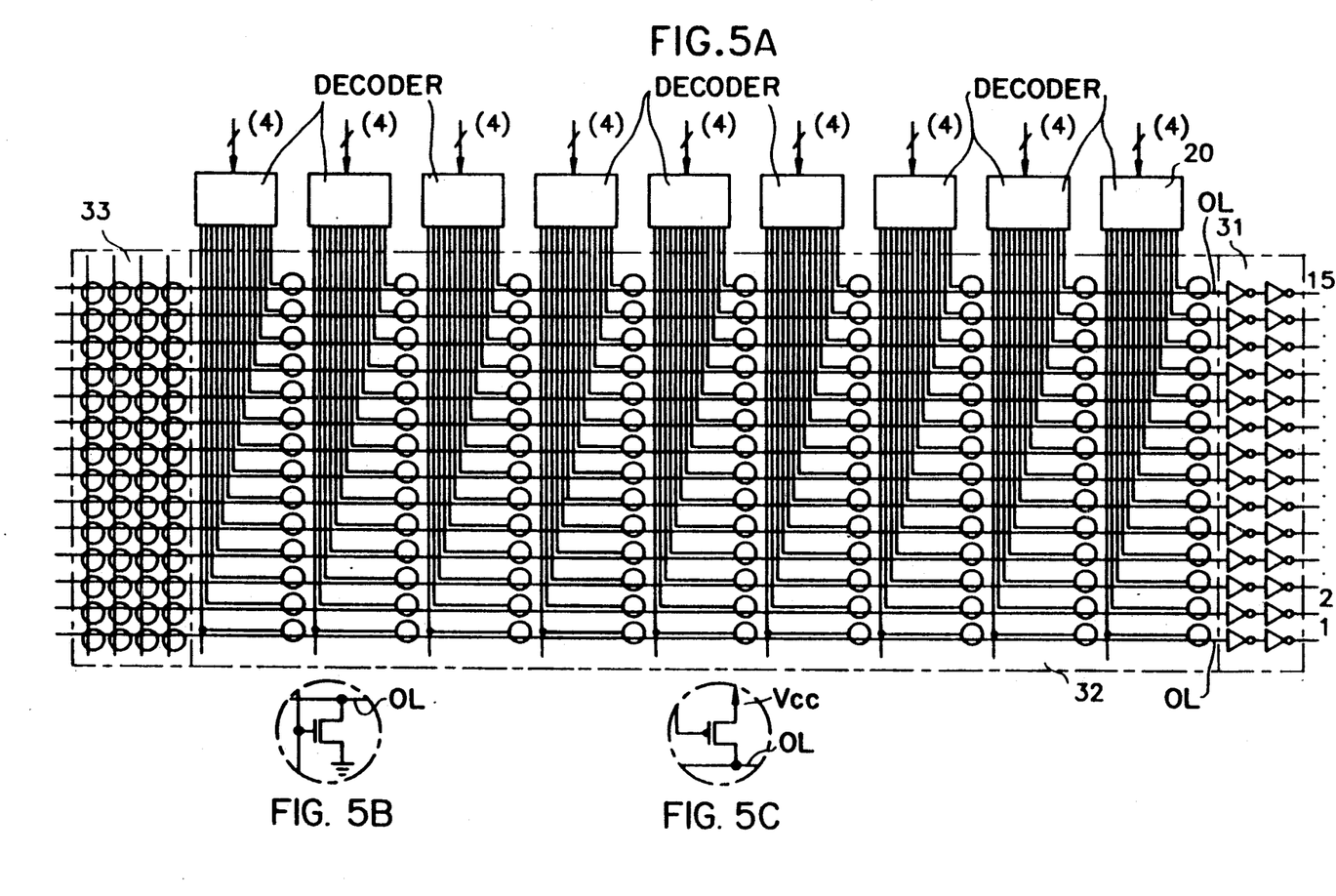
FIG. 5A is a circuit diagram showing one embodiment of a comparison means of FIG. 3.
FIG. 5B is a circuit diagram detail showing the construction of an individual bias synapse of the embodiment of FIG. 5.
FIG. 5C is a circuit diagram detail showing the construction of an individual input neuron synapse of the embodiment of FIG. 5.

FIG. 5 is a circuit diagram of the comparison device. The comparison device 30, which has fifteen levels, outputs "1" if the number of "0s" in the same level among the respective level outputs is greater than or equal to the predetermined rank (for example, the value of rank 5 here) and outputs "0" if the number of "0s" is less than the predetermined rank.

The comparison device 30 includes: fifteen neurons comprising CMOS buffers 31; first input synapses (shown in detail in FIG. 5C) comprising PMOS transistors 32 for connecting a first power source voltage Vcc to the output line OL which is connected to the input terminal of each CMOS buffer 31 with the unit connecting strength according to each output of the same level of the decoder devices 20; and bias synapses (shown in detail in FIG. 5B) comprising NMOS transistors 33 for biasing all output lines OL to a second power source voltage (ground), with the connecting strength of each weight according to the 4-bit rank value.

Therefore, a neuron comprising the CMOS buffers 31 outputs "1" if the summation of the connecting strength of the first input synapse which is connected to the output line OL (i.e., the number of "0s" in the same level output of each decoder device 20) is greater than or equal to that of the second input synapse (i.e., the predetermined rank, for example, the value of rank 5). The CMOS buffer outputs "0" if said summation is less than that of the predetermined rank value.

If the value of "1" or "0" is generated for the fifteen level outputs according to the value of rank 5, the value corresponding to the magnitude of the fifth among the nine inputted data is outputted to be decoded.

The relationship between the input and the output, in the case of rank 5, of the comparison device is given in Table 2.

TABLE 2

| rank input | input | | | | | | | | | Summation of the connecting strength of input synapse | output |
|---|---|---|---|---|---|---|---|---|---|---|---|
| 5 | 11 | 10 | 7 | 12 | 2 | 5 | 13 | 6 | 5 | | |
| 5 | 0 | 0 | 0 | 0 | 0 | 0 | 0 | 0 | 0 | +8 | 1 |
| 5 | 0 | 0 | 0 | 0 | 0 | 0 | 0 | 0 | 0 | 8 | 1 |
| 5 | 0 | 0 | 0 | 0 | 0 | 0 | 1 | 0 | 0 | 8 | 1 |
| 5 | 0 | 0 | 0 | 1 | 0 | 0 | 1 | 0 | 0 | 7 | 1 |
| 5 | 1 | 0 | 0 | 1 | 0 | 0 | 1 | 0 | 0 | 6 | 1 |
| 5 | 1 | 1 | 0 | 1 | 0 | 0 | 1 | 0 | 0 | 5 | 1 |
| 5 | 1 | 1 | 0 | 1 | 0 | 0 | 1 | 0 | 0 | 5 | 1 |
| 5 | 1 | 1 | 0 | 1 | 0 | 0 | 1 | 0 | 0 | 5 | 1 |
| 5 | 1 | 1 | 1 | 1 | 0 | 0 | 1 | 0 | 0 | 4 | 0 |
| 5 | 1 | 1 | 1 | 1 | 0 | 0 | 1 | 1 | 0 | 3 | 0 |
| 5 | 1 | 1 | 1 | 1 | 0 | 1 | 1 | 1 | 1 | 1 | 0 |
| 5 | 1 | 1 | 1 | 1 | 0 | 1 | 1 | 1 | 1 | 1 | 0 |
| 5 | 1 | 1 | 1 | 1 | 1 | 1 | 1 | 1 | 1 | 0 | 0 |
| 5 | 1 | 1 | 1 | 1 | 1 | 1 | 1 | 1 | 1 | 0 | 0 |

Thus, if the rank is 1, the minimum value among the input data is outputted by outputting "1" until the level in which the value of "0" exists. In the same way, if the rank is 9, the maximum value is outputted by outputting "1" only for the level in which the value of "0" exists above nine times. Here, the PMOS and NMOS transistors of the first and the second input synapses are designed according to the same method as in the decoder devices described above.

Figures 6A, 6B, 6C:
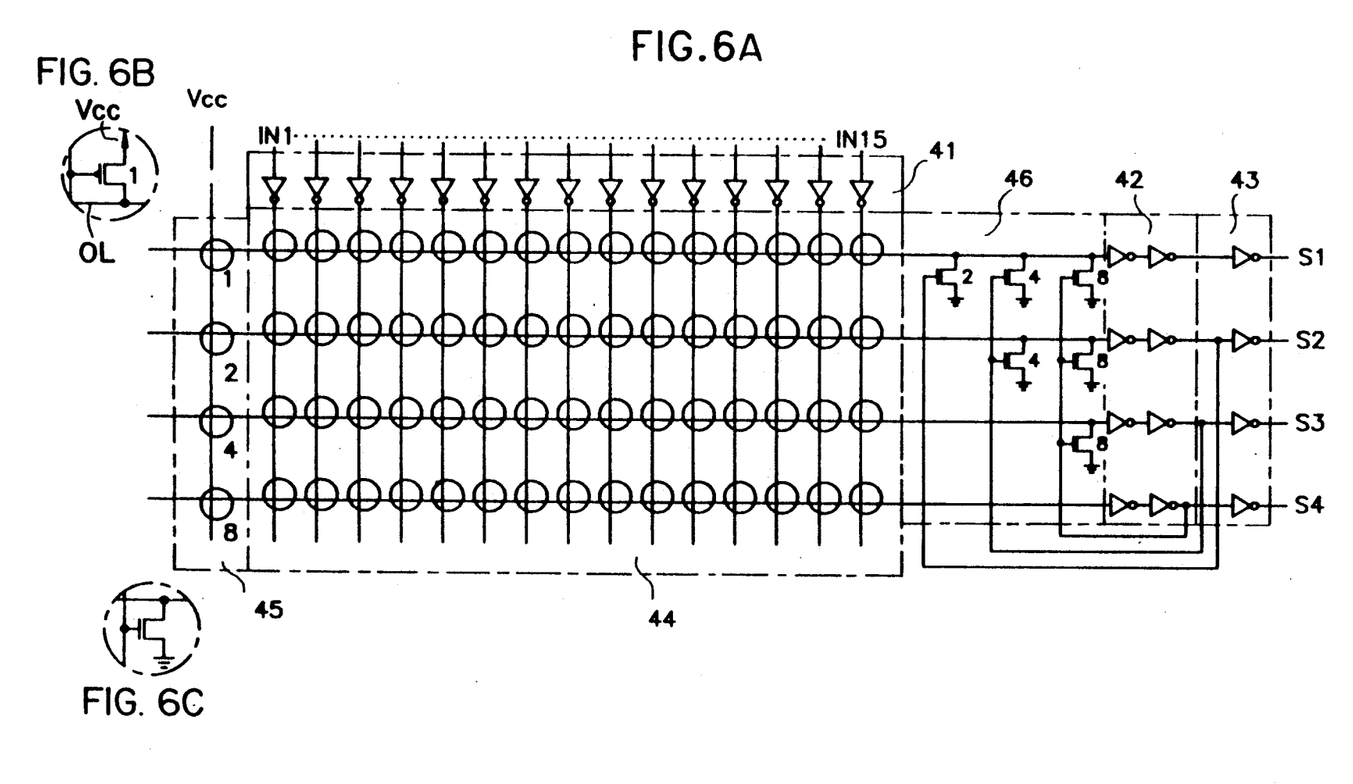
FIG. 6A is a circuit diagram showing one embodiment of a counter of FIG. 3.
FIG. 6B is a circuit diagram detail showing the construction of an individual input neuron synapse of the embodiment of FIG. 6.
FIG. 6C is a circuit diagram detail showing the construction of an individual bias synapse of the embodiment of FIG. 6.

FIG. 6 is a circuit diagram of a 0's counter. The 0's counter 40 outputs the 4-bit binary number by counting the number of "0s" among the inputs after receiving the fifteen outputs from the comparison means 30.

The 0's counter 40 includes: fifteen inverters 41 for inverting the input; four CMOS buffers comprising neurons 42 for buffering the output; four inverters 43 for inverting the output of each neuron; input synapses (shown in detail in FIG. 6B) comprising PMOS transistors 44 for connecting a first power source voltage Vcc to the output line OL with a weighted connecting strength at each output line OL; bias synapses (shown in detail in FIG. 5C) comprising NMOS transistors 45 for connecting a second power source voltage GND to the output line OL with a weighted connecting strength; and feedback synapses comprising NMOS transistors 46 for connecting a second power source voltage (ground) to the output line of the lower bit with the connecting strength of each weight of the higher bit.

Therefore, the output of the 0's counter 40 becomes "1111" when all the inputs are "0" and the output of the 0's counter 40 becomes "0000" when all the inputs are "1". Here, the NMOS and PMOS transistors of the input synapses are designed according to the same method as the decoder devices.

As described above, because the rank filter according to the present invention generates the output through only some inverters with respect to the input, a fast computational result can be obtained within a very little relay time. The above advantage in the present invention results from the structural arrangement of parallely connecting very simple elements in large quantities, just as in a human neural network.

While a preferred embodiment of the present invention has been described and illustrated only for the lightness and darkness degree of 4-bit information, the invention should not be limited thereto but may be otherwise embodied within the scope of the following claims.

What is claimed is:

1. A rank filter for extracting a data value corresponding to a predetermined rank among M kinds of N-bit data, according to the magnitude order of the data value, comprising:
   M means for decoding each N-bit input data into an excited state for all levels equal to or below the corresponding magnitude and a ground state for the other levels, said M means having $2^N-1$ levels;
   a comparison means for outputting the data value corresponding to said predetermined rank which is decoded into an excited state for the level of which the number of ground states is greater than or equal to the value of said predetermined rank, and for outputting a ground state for the other levels of respective level outputs of said M means, said comparison means having $2^N-1$ levels and
   a counter for outputting the data value corresponding to a predetermined rank by counting the number of ground states among the outputs of said comparison means.

2. A rank filter as claimed in claim 1, wherein each of said M decoding means comprises:
   N input lines;
   $2^N-1$ output lines which are coupled with said input lines;
   inverters for inverting the inputs supplied to said N input lines;
   input synapses for coupling a first power source voltage to said output lines with a weighted connecting strength according to a value of each bit of said N-bit input data;
   bias synapses for connecting a second power source voltage to each output line with a weighted connecting strength according to said $2^N-1$ levels; and
   neurons for outputting an excited state if the summation of the connecting strength of the input synapses is greater than or equal to that of the connecting strength of the bias synapses, and a ground state if the summation of the connecting strength of the input synapses is less than that of the bias synapses.

3. A rank filter as claimed in claim 2, wherein said comparison means comprises:
   $2^N-1$ output lines;
   input synapses for respectively connecting a first power source voltage to said each corresponding output line with a weighted connecting strength according to the output decoded by each of said M decoding means;
   bias synapses for respectively connecting a second power source voltage to all the output lines with a weighted connecting strength according to the value of said predetermined rank; and
   neurons for outputting an excited state if the summation of the connecting strength of the input synapses is greater than or equal to that of the bias synapses.

4. A rank filter as claimed in claim 3, wherein said counter comprises:
   $2^N-1$ input lines;
   N output lines which are coupled with said input lines;
   inverters for inverting the outputs which are supplied to said input lines;
   input synapses for connecting a first power source voltage to said output lines with a weighted connecting strength according to the input from said inverters;
   bias synapses for biasing said N output lines by a second power source voltage with a weighted connecting strength according to each level;
   neurons for outputting an excited state if the summation of the connecting strength of the input synapses is greater than or equal to that of the bias synapses and feedback synapses, and for outputting a ground state if the summation is less than that of the bias synapses and feedback synapses;
   feedback synapses for connecting the second power source voltage to each output line of the lower bit with a weighted connecting strength according to the output of the higher bit from said neurons; and
   inverters for inverting the outputs of said neurons.

5. A rank filter as claimed in claim 4, wherein said input synapses comprise PMOS transistors and said bias synapses and feedback synapses comprise NMOS transistors.

6. A rank filter as claimed in claim 5, wherein the connecting strength of said synapses are established by the geometrical aspect ratio, that is, width of a channel divided by length of a channel of a MOS transistor.

7. A rank filter as claimed in claim 6, wherein a unit connecting strength of 1 for said input synapses means that the geometrical aspect ratio of the PMOS transistors is 6 $\mu$m/2 $\mu$m; and a unit connecting strength of 1 for said bias synapses and said feedback synapses means that the geometrical aspect ratio of the NMOS transistors is 2 $\mu$m/2 $\mu$m.

8. A rank filter as claimed in claim 7, wherein said neuron comprises a CMOS buffer having two CMOS inverters connected in series with each other.

* * * * *